United States Patent
Hao et al.

(10) Patent No.: US 10,084,132 B2
(45) Date of Patent: Sep. 25, 2018

(54) GROOVE STRUCTURE FOR PRINTING COATING PROCESS AND MANUFACTURING METHOD THEREOF

(71) Applicant: Shenzhen China Star Optoelectronics Technology Co., Ltd., Shenzhen (CN)

(72) Inventors: Peng Hao, Shenzhen (CN); Poyen Lu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 162 days.

(21) Appl. No.: 15/114,851

(22) PCT Filed: May 19, 2016

(86) PCT No.: PCT/CN2016/082701
§ 371 (c)(1),
(2) Date: Jul. 28, 2016

(87) PCT Pub. No.: WO2017/177508
PCT Pub. Date: Oct. 19, 2017

(65) Prior Publication Data
US 2018/0108839 A1  Apr. 19, 2018

(30) Foreign Application Priority Data

Apr. 15, 2016  (CN) .......................... 2016 1 0236054

(51) Int. Cl.
*H01L 21/00* (2006.01)
*H01L 51/00* (2006.01)
(Continued)

(52) U.S. Cl.
CPC ...... *H01L 51/0004* (2013.01); *H01L 27/3246* (2013.01); *H01L 51/0005* (2013.01); *H01L 51/56* (2013.01); *B41M 5/00* (2013.01)

(58) Field of Classification Search
CPC .. H01L 27/3246; H01L 51/0004; H01L 51/56
See application file for complete search history.

(56) References Cited

U.S. PATENT DOCUMENTS 7,294,856 B2 * 11/2007 Ito ...................... H01L 27/3246
257/13
7,777,411 B2 * 8/2010 Seki .................... H01L 27/3246
313/506

FOREIGN PATENT DOCUMENTS

CN  101013719 A  8/2007
CN  101399283 A  4/2009

* cited by examiner

*Primary Examiner* — Richard Booth
(74) *Attorney, Agent, or Firm* — Leong C. Lei

(57) ABSTRACT

The invention provides a groove structure for printing coating process and manufacturing method thereof. With the groove structure as an interpenetrating and co-axial stacked structure of a first and second grooves formed respectively by first causeway and second causeways, and the smallest part of the second groove opening greater than the largest part of the first groove opening; the inclining inner circumferential surface of the first groove hydrophilic, while the upper surface of the first causeway, the inclining inner circumferential surface of the second groove, and the upper surface of the second causeway hydrophobic, the present invention is able to increase the size of the groove opening for printing coating process without reducing the pixels per inch so that the ink drops can be more easily dripped into the groove. As such, the invention reduces the demand on printer precision and manufacturing difficulty to improve competitiveness.

14 Claims, 5 Drawing Sheets

(51) Int. Cl.
*H01L 51/56* (2006.01)
*H01L 27/32* (2006.01)
*B41M 5/00* (2006.01)

Step 1: providing a substrate (10) and a first causeway material, using a coating, drying and etching process with the first causeway material to form a first causeway (11) on the substrate (10), and the first causeway (11) surrounding to form a first groove (14);

— 1

Step 2: providing a second causeway material, using a coating, drying and etching process with the second causeway material to form a second causeway (12) on the first causeway (11), and the second causeway (12) surrounding to form a second groove (15);
the first groove (14) and the second groove (15) are interpenetrating and co-axial, and the smallest part of the opening of the second groove (15) is greater than the largest part of the opening of the first groove (14); the inclining inner circumferential surface of the first groove (14) formed by the first causeway (11) is a hydrophilic surface; the upper surface of the first causeway (11), the inclining inner circumferential surface of the second groove (15) formed by the second causeway (12), and the upper surface of the second causeway (12) are hydrophobic surfaces.

GROOVE STRUCTURE FOR PRINTING COATING PROCESS AND MANUFACTURING METHOD THEREOF

BACKGROUND OF THE INVENTION

1. Field of the Invention

The present invention relates to the field of manufacturing organic light-emitting diode (OLED) display, and in particular to a groove structure for printing coating process and manufacturing method thereof.

2. The Related Arts

The organic light-emitting diode (OLED) display has the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

In general, the structure of an OLED display comprises: a substrate, an anode, a cathode, and an organic functional layer sandwiched between the anode and the cathode. The organic functional layer generally comprises a hole transport functional layer (HTL), an emissive functional layer (EML), and an electron transport functional layer (ETL). Each functional layer can be a single layer or a multi-layer structure. For example, the HTL can be further divided into a hole injection layer (HIL) and a hole transport layer; the ETL can be further divided into an electron injection layer (EIL) and an electron transport layer. The light-emission principle of the OLED display is that the semiconductor material and the organic light-emitting material emit light through the carrier injection and compound driven by an electric field.

The OLED display is usually manufactured as follows: first, forming the anode on the substrate, forming the HTL on the anode, forming EML on the HTL, forming ETL on the EML, forming cathode on the ETL, wherein the anode and the cathode are made of indium-tin-oxide (ITO). The organic functional, i.e., HTL, EML and ETL, are usually manufactured by vacuum thermal evaporation and solution process.

The solution process is to process the required material, such as dividing into nano-scale small particles and dissolved in a corresponding solution. Then a coating facility is used to deposit the solution on the surface of the substrate and wait for the solvent to evaporate to form a thin film on the substrate surface. Specifically, the coating process can be one of the following: ink-jet printing, nozzle printing, roller printing, spin printing, and so on.

On the substrate using the printing coating process, a groove is usually manufactured to confine the ink. After baking, the ink shrinks within the confinement of the groove to form a thin film. Refer to FIG. 1, a groove 120 is formed by a causeway 110 surrounding the circumference of the ITO anode 130. As shown in FIG. 2, a high precision printer drips the ink accurately into the groove 120. By depositing the ink inside the groove 120, the HIL 140, hole transport layer 150, EML 160 are formed.

As the display technology develops rapidly, the resolution of the display panel becomes ever higher. To realize high resolution, a smaller pixel must be manufactured, which in turn demands a smaller opening design (e.g., <40 um). This places a critical demand on the printing facility. At present, the printers in the market do not provide such high pixels pr inch (PPI). As shown in FIG. 3, if the precision of the printer is insufficient or the opening of the groove is too small, the ink dripped from the printer may not fall into the groove, which leads to poor yield rate for manufacturing process.

SUMMARY OF THE INVENTION

The object of the present invention is to provide a groove structure for printing coating process, able to increase the opening of the groove for printing coating process without reducing the pixels per inch to lower the demand on the printer precision and reduce the difficulty in manufacturing high resolution OLED display to improve product competitiveness.

Another object of the present invention is to provide a manufacturing method of a groove structure for printing coating process, wherein the groove structure manufactured by the method can increase the opening of the groove for printing coating process without reducing the pixels per inch to lower the demand on the printer precision and reduce the difficulty in manufacturing high resolution OLED display to improve product competitiveness.

To achieve the above object, the present invention provides a groove structure for printing coating process, the groove disposed on a substrate and comprising: a first causeway, a first groove surrounded and formed by the first causeway, a second causeway disposed on the first causeway, and a second groove surrounded and formed by the second causeway; the first groove and the second groove being interpenetrating and co-axial, and the smallest part of the opening of the second groove being greater than the largest part of the opening of the first groove; the inclining inner circumferential surface of the first groove formed by the first causeway being a hydrophilic surface; the upper surface of the first causeway, the inclining inner circumferential surface of the second groove formed by the second causeway, and the upper surface of the second causeway being hydrophobic surfaces.

The groove structure is used in printing coating process for the organic functional layer of the OLED display; the substrate is disposed with an anode, and the first causeway is disposed surrounding the circumference of the anode and on the substrate.

The size of the opening of the first groove depends on the pixels per inch of the OLED display.

The groove structure further comprises a plurality of stack extended causeways disposed on the second causeway, and a plurality of stack extended grooves surrounded and formed by the plurality of extended causeways; the sizes of the openings of the plurality of extended grooves gradually increase from the bottom up, and the smallest part of the opening of an upper groove is greater than the largest part of the opening of the lower groove; the plurality of extended grooves are interpenetrating co-axial with and the first groove and the second groove; the inclining inner circumferential surface of the plurality of extended grooves formed by the extended causeways and the upper surface of the extended causeways are hydrophobic surfaces.

The distance from the bottom corner of the second causeway to the top corner of the first causeway is no more than ⅔ of radius of the ink drop of the printing coating process.

The distance from the bottom corner of the second causeway to the top corner of the first causeway is 10-20 um.

The present invention also provides a manufacturing method of groove structure for printing coating process, which comprises the following steps of: Step 1: providing a substrate and a first causeway material, using a coating, drying and etching process with the first causeway material to form a first causeway on the substrate, and the first causeway surrounding to form a first groove; Step 2: providing a second causeway material, using a coating, drying and etching process with the second causeway material to form a second causeway on the first causeway and the second causeway surrounding to form a second groove; the first groove and the second groove being interpenetrating and co-axial, and the smallest part of the opening of the second groove being greater than the largest part of the opening of the first groove; the inclining inner circumferential surface of the first groove formed by the first causeway being a hydrophilic surface; the upper surface of the first causeway, the inclining inner circumferential surface of the second groove formed by the second causeway, and the upper surface of the second causeway being hydrophobic surfaces.

The groove structure is used in printing coating process for the organic functional layer of the OLED display; the substrate is disposed with an anode, and the first causeway is disposed surrounding the circumference of the anode and on the substrate; and the size of the opening of the first groove depends on the pixels per inch of the OLED display.

The distance from the bottom corner of the second causeway to the top corner of the first causeway is no more than ⅔ of radius of the ink drop of the printing coating process.

The distance from the bottom corner of the second causeway to the top corner of the first causeway is 10-20 um.

The present invention also provides a manufacturing method of groove structure for printing coating process, which comprises the following steps of: Step 1: providing a substrate and a first causeway material, using a coating, drying and etching process with the first causeway material to form a first causeway on the substrate, and the first causeway surrounding to form a first groove; Step 2: providing a second causeway material, using a coating, drying and etching process with the second causeway material to form a second causeway on the first causeway, and the second causeway surrounding to form a second groove; the first groove and the second groove being interpenetrating and co-axial, and the smallest part of the opening of the second groove being greater than the largest part of the opening of the first groove; the inclining inner circumferential surface of the first groove formed by the first causeway being a hydrophilic surface; the upper surface of the first causeway, the inclining inner circumferential surface of the second groove formed by the second causeway, and the upper surface of the second causeway being hydrophobic surfaces; further comprises forming a plurality of stack extended causeways disposed on the second causeway, and a plurality of stack extended grooves surrounded and formed by the plurality of extended causeways; the sizes of the openings of the plurality of extended grooves gradually increase from the bottom up, and the smallest part of the opening of an upper groove is greater than the largest part of the opening of the lower groove; the plurality of extended grooves are interpenetrating co-axial with and the first groove and the second groove; the inclining inner circumferential surface of the plurality of extended grooves formed by the extended causeways and the upper surface of the extended causeways are hydrophobic surfaces; wherein The groove structure is used in printing coating process for the organic functional layer of the OLED display.

Compared to the known techniques, the present invention provides the following advantages: the present invention provides a groove structure for printing coating process and manufacturing method thereof. By designing the groove structure as stacked structure of a first groove formed by the first causeway and a second groove formed by a second causeway, and the first groove and the second groove being interpenetrating and co-axial, and the smallest part of the opening of the second groove being greater than the largest part of the opening of the first groove; the inclining inner circumferential surface of the first groove formed by the first causeway being a hydrophilic surface; the upper surface of the first causeway, the inclining inner circumferential surface of the second groove formed by the second causeway, and the upper surface of the second causeway being hydrophobic surfaces; the present invention is able to increase the size of the opening of the groove for printing coating process without reducing the pixels per inch so that the ink drops can be more easily dripped into the groove. As such, the demand on the printer precision is reduced and the manufacturing difficulty for high resolution OLED display is lowered to improve competitiveness. The present invention also provides a manufacturing method of groove structure for printing coating process, the groove structure obtained by the method can increase the size of the opening of the groove for printing coating process without reducing the pixels per inch so that the ink drops can be more easily dripped into the groove. As such, the demand on the printer precision is reduced and the manufacturing difficulty for high resolution OLED display is lowered to improve competitiveness.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings:

FIG. 5 is a schematic view a flowchart of the manufacturing method of the groove structure for printing coating method provided by an embodiment of the present invention.

DETAILED DESCRIPTION OF THE PREFERRED EMBODIMENTS

To further explain the technical means and effect of the present invention, the following refers to embodiments and drawings for detailed description.

Figure 1:
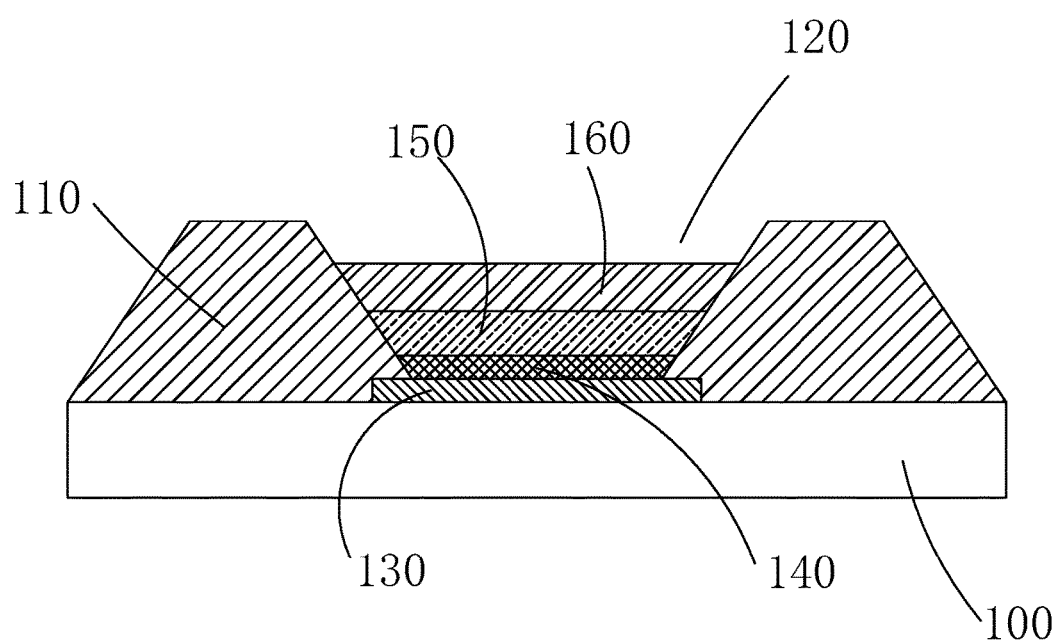
FIG. 1 is a schematic view showing a known groove structure for printing coating process.
Figure 2:
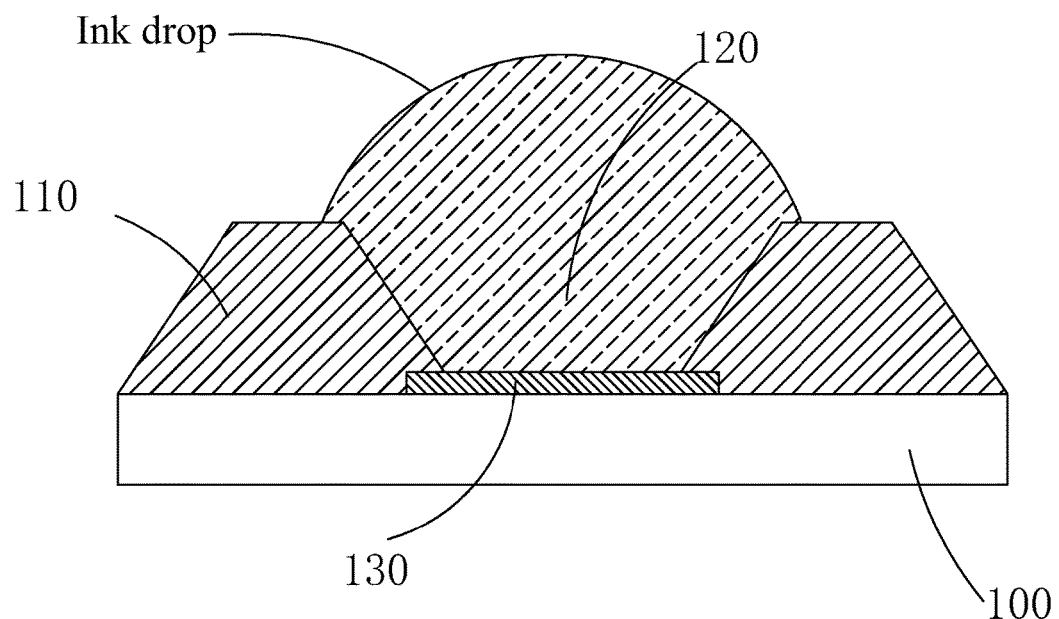
FIG. 2 is a schematic view showing the relation between the groove and the ink in FIG. 1.
Figure 3:
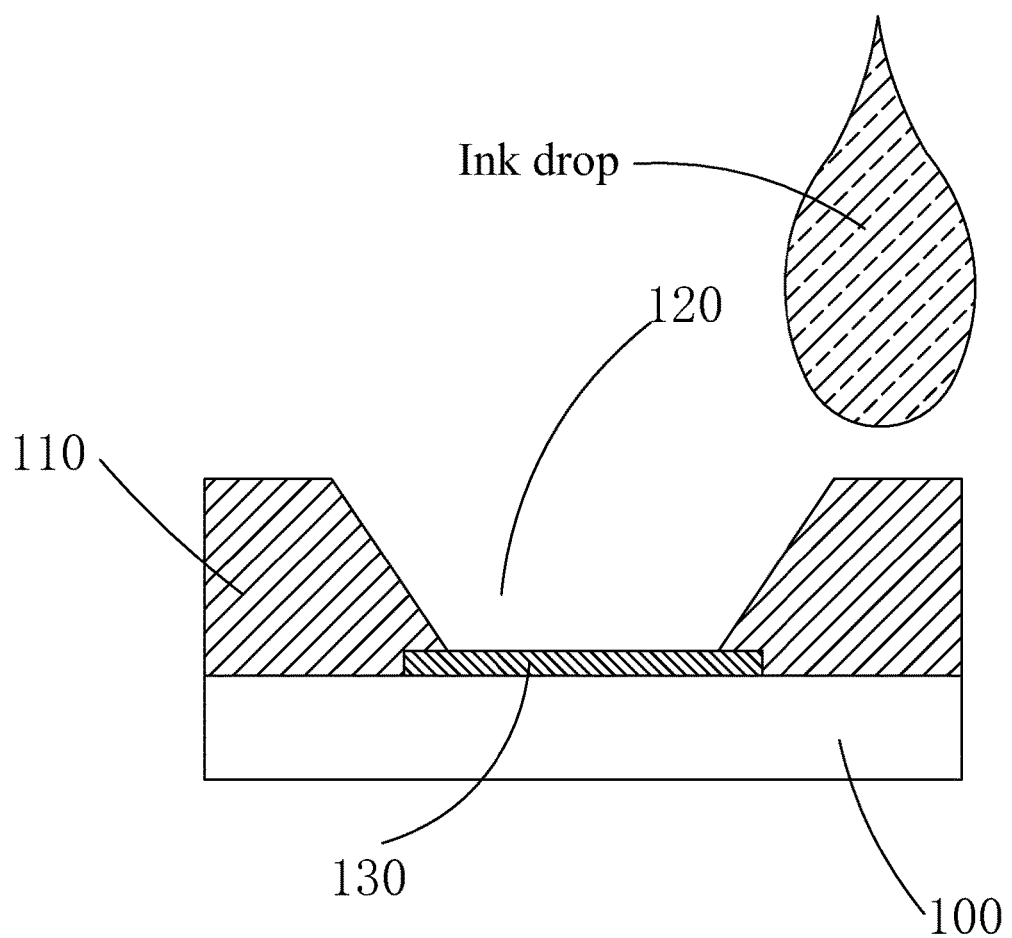
FIG. 3 is a schematic view showing the ink dripped onto outside of the groove when the PPI increases and the groove opening is reduced in the known technology.
Figure 4:
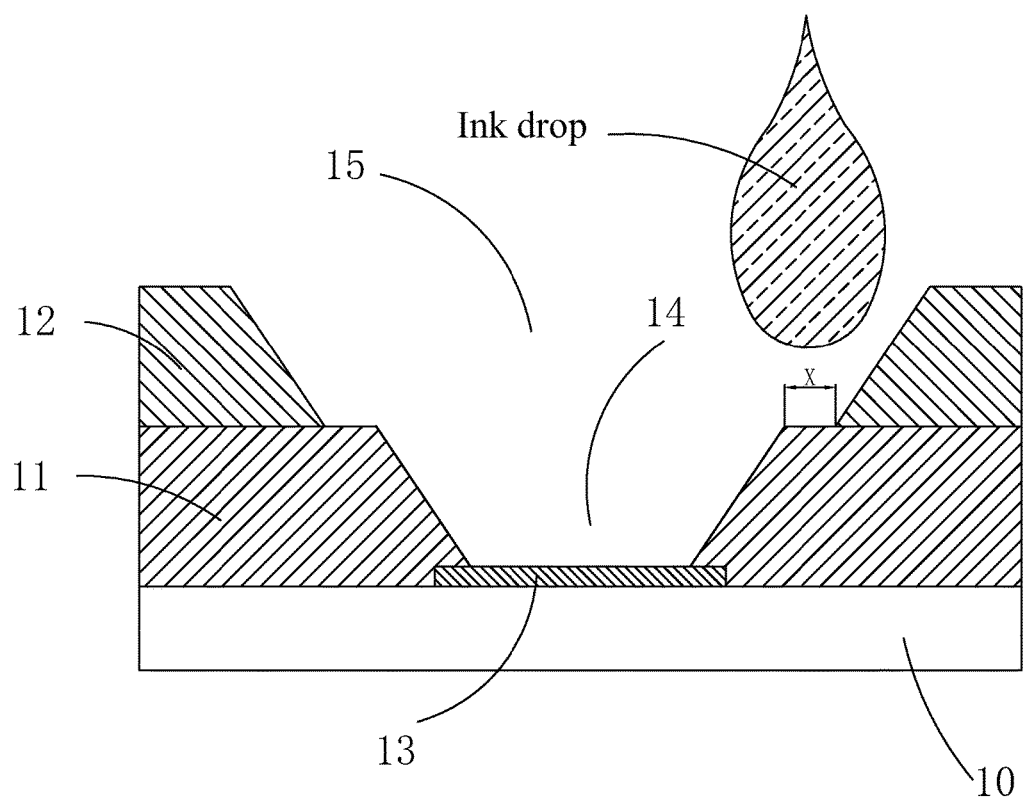
FIG. 4 is a schematic view showing the groove structure for printing coating process provided by an embodiment of the present invention, and ink dripping with the groove structure.

Refer to FIG. 4. The present invention provides a groove structure for printing coating process, the groove disposed on a substrate 10 and comprising: a first causeway 11, a first groove 14 surrounded and formed by the first causeway 11, a second causeway 12 disposed on the first causeway 11, and a second groove 15 surrounded and formed by the second causeway 12; the first groove 14 and the second groove 15 being interpenetrating and co-axial, and the smallest part of the opening of the second groove 15 being greater than the largest part of the opening of the first groove 14; the inclining inner circumferential surface of the first groove 14 formed by the first causeway 11 being a hydrophilic surface; the upper surface of the first causeway 11, the inclining inner circumferential surface of the second groove 15 formed by the second causeway 12, and the upper surface of the second causeway 12 being hydrophobic surfaces.

Specifically, the groove structure is in the printing coating process for forming the organic functional layer of the OLED display; wherein the anode 13 is provided on the substrate 10, the first causeway 11 is provided on the peripheral circumference of the anode 13 and on the substrate 10. With the groove structure in printing coating process, as long as the printing facility is capable of dripping ink drop into the second groove 15 successfully, the printing is successful. When the ink drop is dripped outside of the first groove 14 but into the second groove 15, the ink drop will flow into the first groove 14 because the upper surface of the first causeway 11, the inclining inner surfaces of the second groove 15 formed by the second causeway 12, and the upper surface of the second causeway are all hydrophobic surfaces while the inclining inner surface of the first groove 14 formed by the first causeway 11 is hydrophilic so that the ink drop will be locked inside the first groove 14 for film deposition.

At this point, the required precision for the printer is able to drip the ink drop into the opening of the second groove 15 to manufacture the OLED display with pixel opening equivalent to the opening of the first groove 14. As such, using the above groove structure in high resolution OLED display manufacturing can effectively reduce the demand on the printer precision and the manufacturing difficulty for high resolution OLED display to improve competitiveness.

Specifically, the substrate 10 is a thin film transistor (TFT) substrate.

Specifically, the size of the opening of the first groove depends on the pixels per inch of the OLED display.

Moreover, the above groove structure is not limited to the two-layered groove structure. The groove structure may further dispose a plurality of extended causeways stacked on the second causeway 12 to form a plurality of stack extended grooves on top of the second groove 15 to further reduce the difficulty of dripping the ink drop into the groove structure.

Specifically, the sizes of the openings of the plurality of extended grooves gradually increase from the bottom up, and the smallest part of the opening of an upper groove is greater than the largest part of the opening of the lower groove; the plurality of extended grooves are interpenetrating co-axial with and the first groove 14 and the second groove 15; the inclining inner circumferential surface of the plurality of extended grooves formed by the extended causeways and the upper surface of the extended causeways are hydrophobic surfaces. In other words, other than the inclining inner surface of the first groove 14 formed by the first causeway 11 being hydrophilic, the remaining surfaces must be all hydrophobic surfaces so that the ink drop will be locked inside the first groove 14 for film deposition.

It should be noted that the distance X from the bottom corner of the second causeway 12 to the top corner of the first causeway 11 is no more than ⅔ of radius of the ink drop of the printing coating process.

Preferably, the distance X from the bottom corner of the second causeway 12 to the top corner of the first causeway 11 is 10-20 um. The lower surface of the opening of the first groove 14 and second groove 15 is smaller than the upper surface of the opening, i.e. the shape of the first groove 14 and second groove 15 are inverted truncated cone or inverted trapezoid.

Specifically, the ink is dripped into the first groove 14 during OLED display to manufacture the organic functional layer, including HIL, hole transport layer and EML.

Refer to FIG. 5, the present invention also provides a manufacturing method of the groove structure for printing coating process, which comprises the following steps of:

Step 1: providing a substrate 10 and a first causeway material, using a coating, drying and etching process with the first causeway material to form a first causeway 11 on the substrate 10, and the first causeway 11 surrounding to form a first groove 14.

Specifically, Step 1 comprises: first, coating the first causeway material on the substrate 10; after drying, the first causeway material being cured to from a thin film, and then etching the thin film of the first causeway material to form the first causeway 11 and the first groove 14 surrounded by the first causeway 11.

Moreover, the groove structure is used in printing coating process for the organic functional layer of the OLED display. The first causeway 11 and the first groove 14 surrounded and formed by the first causeway 11 are arranged to lay out on the substrate 10 corresponding to the pixel structure of the OLED display. The size of the opening of the first groove 14 depends on the pixels per inch of the OLED display.

Specifically, the substrate 10 is a thin film transistor (TFT) substrate.

Step 2: providing a second causeway material, using a coating, drying and etching process with the second causeway material to form a second causeway 12 on the first causeway 11, and the second causeway 12 surrounding to form a second groove 15.

Specifically, Step 2 comprises: first, coating the second causeway material on the first causeway 11; after drying, the first causeway material being cured to from a thin film, and then etching the thin film of the second causeway material to form the second causeway 12 and the second groove 15 surrounded by the second causeway 12.

Moreover, the groove structure is used in printing coating process for the organic functional layer of the OLED display. The second causeway 12 and the second groove 15 surrounded and formed by the second causeway 12 are arranged to lay out on the substrate 10 corresponding to the pixel structure of the OLED display.

Specifically, the first groove 14 and the second groove 15 are interpenetrating and co-axial, and the smallest part of the opening of the second groove 15 is greater than the largest part of the opening of the first groove 14.

The inclining inner circumferential surface of the first groove 14 formed by the first causeway 11 is a hydrophilic surface; the upper surface of the first causeway 11, the inclining inner circumferential surface of the second groove 15 formed by the second causeway 12, and the upper surface of the second causeway 12 are hydrophobic surfaces.

Specifically, the groove structure is used in printing coating process for the organic functional layer of the OLED display; the substrate 10 is disposed with an anode 13, and the first causeway 11 is disposed surrounding the circumference of the anode 13 and on the substrate 10. With the groove structure in printing coating process, as long as the printing facility is capable of dripping ink drop into the second groove 15 successfully, the printing is successful. When the ink drop is dripped outside of the first groove 14 but into the second groove 15, the ink drop will flow into the first groove 14 because the upper surface of the first causeway 11, the inclining inner surfaces of the second groove 15 formed by the second causeway 12, and the upper surface of the second causeway are all hydrophobic surfaces while the inclining inner surface of the first groove 14 formed by the first causeway 11 is hydrophilic so that the ink drop will be locked inside the first groove 14 for film deposition.

At this point, the required precision for the printer is able to drip the ink drop into the opening of the second groove 15 to manufacture the OLED display with pixel opening equivalent to the opening of the first groove 14. As such, using the above groove structure in high resolution OLED display manufacturing can effectively reduce the demand on the printer precision and the manufacturing difficulty for high resolution OLED display to improve competitiveness.

Moreover, the above groove structure is not limited to the two-layered groove structure. The groove structure may further dispose a plurality of extended causeways stacked on the second causeway 12 to form a plurality of stack extended grooves on top of the second groove 15 to further reduce the difficulty of dripping the ink drop into the groove structure.

Specifically, the sizes of the openings of the plurality of extended grooves gradually increase from the bottom up, and the smallest part of the opening of an upper groove is greater than the largest part of the opening of the lower groove; the plurality of extended grooves are interpenetrating co-axial with and the first groove 14 and the second groove 15; the inclining inner circumferential surface of the plurality of extended grooves formed by the extended causeways and the upper surface of the extended causeways are hydrophobic surfaces. In other words, other than the inclining inner surface of the first groove 14 formed by the first causeway 11 being hydrophilic, the remaining surfaces must be all hydrophobic surfaces so that the ink drop will be locked inside the first groove 14 for film deposition.

It should be noted that the distance X from the bottom corner of the second causeway 12 to the top corner of the first causeway 11 is no more than ⅔ of radius of the ink drop of the printing coating process.

Preferably, the distance X from the bottom corner of the second causeway 12 to the top corner of the first causeway 11 is 10-20 um. The lower surface of the opening of the first groove 14 and second groove 15 is smaller than the upper surface of the opening, i.e. the shape of the first groove 14 and second groove 15 are inverted truncated cone or inverted trapezoid.

Specifically, the ink is dripped into the first groove 14 during OLED display to manufacture the organic functional layer, including HIL, hole transport layer and EML.

In summary, the present invention provides a groove structure for printing coating process and manufacturing method thereof. By designing the groove structure as stacked structure of a first groove formed by the first causeway and a second groove formed by a second causeway, and the first groove and the second groove being interpenetrating and co-axial, and the smallest part of the opening of the second groove being greater than the largest part of the opening of the first groove; the inclining inner circumferential surface of the first groove formed by the first causeway being a hydrophilic surface; the upper surface of the first causeway, the inclining inner circumferential surface of the second groove formed by the second causeway, and the upper surface of the second causeway being hydrophobic surfaces; the present invention is able to increase the size of the opening of the groove for printing coating process without reducing the pixels per inch so that the ink drops can be more easily dripped into the groove. As such, the demand on the printer precision is reduced and the manufacturing difficulty for high resolution OLED display is lowered to improve competitiveness. The present invention also provides a manufacturing method of groove structure for printing coating process, the groove structure obtained by the method can increase the size of the opening of the groove for printing coating process without reducing the pixels per inch so that the ink drops can be more easily dripped into the groove. As such, the demand on the printer precision is reduced and the manufacturing difficulty for high resolution OLED display is lowered to improve competitiveness.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A groove structure for printing coating process, the groove disposed on a substrate and comprising: a first causeway, a first groove surrounded and formed by the first causeway, a second causeway disposed on the first causeway, and a second groove surrounded and formed by the second causeway;

the first groove and the second groove being interpenetrating and co-axial, and the smallest part of the opening of the second groove being greater than the largest part of the opening of the first groove;

the inclining inner circumferential surface of the first groove formed by the first causeway being a hydrophilic surface; the upper surface of the first causeway, the inclining inner circumferential surface of the second groove formed by the second causeway, and the upper surface of the second causeway being hydrophobic surfaces;

wherein the first causeway has a first surface forming the inclining inner circumferential surface of the first groove and a second surface forming the upper surface of the first causeway, wherein the first surface and the second surface of the first causeway are of opposite surface properties and are respectively hydrophilic and hydrophobic.

2. The groove structure for printing coating process as claimed in claim 1, wherein the groove structure is used in printing coating process for the organic functional layer of the organic light-emitting diode (OLED) display; the substrate is disposed with an anode, and the first causeway is disposed surrounding the circumference of the anode and on the substrate.

3. The groove structure for printing coating process as claimed in claim 2, wherein the size of the opening of the first groove depends on the pixels per inch of the OLED display.

4. The groove structure for printing coating process as claimed in claim 1, further comprises a plurality of stack extended causeways disposed on the second causeway, and a plurality of stack extended grooves surrounded and formed by the plurality of extended causeways;
   the sizes of the openings of the plurality of extended grooves gradually increase from the bottom up, and the smallest part of the opening of an upper groove is greater than the largest part of the opening of the lower groove;
   the plurality of extended grooves are interpenetrating co-axial with and the first groove and the second groove; and
   the inclining inner circumferential surface of the plurality of extended grooves formed by the extended causeways and the upper surface of the extended causeways are hydrophobic surfaces.

5. The groove structure for printing coating process as claimed in claim 1, wherein the distance from the bottom corner of the second causeway to the top corner of the first causeway is no more than ⅔ of radius of the ink drop of the printing coating process.

6. The groove structure for printing coating process as claimed in claim 5, wherein the distance from the bottom corner of the second causeway to the top corner of the first causeway is 10-20 um.

7. A manufacturing method of groove structure for printing coating process, which comprises the following steps of:
   Step 1: providing a substrate and a first causeway material, using a coating, drying and etching process with the first causeway material to form a first causeway on the substrate, and the first causeway surrounding to form a first groove;
   Step 2: providing a second causeway material, using a coating, drying and etching process with the second causeway material to form a second causeway on the first causeway and the second causeway surrounding to form a second groove;
   the first groove and the second groove being interpenetrating and co-axial, and the smallest part of the opening of the second groove being greater than the largest part of the opening of the first groove; and
   the inclining inner circumferential surface of the first groove formed by the first causeway being a hydrophilic surface, while the upper surface of the first causeway, the inclining inner circumferential surface of the second groove formed by the second causeway, and the upper surface of the second causeway being hydrophobic surfaces;
   wherein the first causeway has a first surface forming the inclining inner circumferential surface of the first groove and a second surface forming the upper surface of the first causeway, wherein the first surface and the second surface of the first causeway are of opposite surface properties and are respectively hydrophilic and hydrophobic.

8. The manufacturing method of groove structure for printing coating process as claimed in claim 7, wherein the groove structure is used in printing coating process for the organic functional layer of the OLED display; the substrate is disposed with an anode, and the first causeway is disposed surrounding the circumference of the anode and on the substrate; and the size of the opening of the first groove depends on the pixels per inch of the OLED display.

9. The manufacturing method of groove structure for printing coating process as claimed in claim 7, wherein the distance from the bottom corner of the second causeway to the top corner of the first causeway is no more than ⅔ of radius of the ink drop of the printing coating process.

10. The manufacturing method of groove structure for printing coating process as claimed in claim 9, wherein the distance from the bottom corner of the second causeway to the top corner of the first causeway is 20-30 um.

11. A groove structure for printing coating process, the groove disposed on a substrate and comprising: a first causeway, a first groove surrounded and formed by the first causeway, a second causeway disposed on the first causeway, and a second groove surrounded and formed by the second causeway;
   the first groove and the second groove being interpenetrating and co-axial, and the smallest part of the opening of the second groove being greater than the largest part of the opening of the first groove;
   the inclining inner circumferential surface of the first groove formed by the first causeway being a hydrophilic surface; the upper surface of the first causeway, the inclining inner circumferential surface of the second groove formed by the second causeway, and the upper surface of the second causeway being hydrophobic surfaces;
   wherein the first causeway has a first surface forming the inclining inner circumferential surface of the first groove and a second surface forming the upper surface of the first causeway, wherein the first surface and the second surface of the first causeway are of opposite surface properties and are respectively hydrophilic and hydrophobic;
   further comprising a plurality of stack extended causeways disposed on the second causeway, and a plurality of stack extended grooves surrounded and formed by the plurality of extended causeways;
   the sizes of the openings of the plurality of extended grooves gradually increasing from the bottom up, and the smallest part of the opening of an upper groove being greater than the largest part of the opening of the lower groove;
   the plurality of extended grooves being interpenetrating co-axial with and the first groove and the second groove; and
   the inclining inner circumferential surface of the plurality of extended grooves formed by the extended causeways and the upper surface of the extended causeways being hydrophobic surfaces;
   wherein the groove structure being used in printing coating process for the organic functional layer of the organic light-emitting diode (OLED) display; the substrate being disposed with an anode, and the first causeway being disposed surrounding the circumference of the anode and on the substrate.

12. The groove structure for printing coating process as claimed in claim 11, wherein the size of the opening of the first groove depends on the pixels per inch of the OLED display.

13. The groove structure for printing coating process as claimed in claim 11, wherein the distance from the bottom corner of the second causeway to the top corner of the first causeway is no more than ⅔ of radius of the ink drop of the printing coating process.

14. The groove structure for printing coating process as claimed in claim 13, wherein the distance from the bottom corner of the second causeway to the top corner of the first causeway is 10-20 um.

\* \* \* \* \*